United States Patent [19]
Hed

[11] Patent Number: 5,036,042
[45] Date of Patent: Jul. 30, 1991

[54] SWITCHABLE SUPERCONDUCTING MIRRORS

[75] Inventor: Aharon Z. Hed, Nashua, N.H.

[73] Assignee: International Superconductor Corp., Riverdale, N.Y.

[21] Appl. No.: 291,685

[22] Filed: Dec. 29, 1988

[51] Int. Cl.$^5$ .......................... H01B 12/00; G02B 5/08
[52] U.S. Cl. .......................................... 505/1; 350/610; 350/321; 350/320; 505/727
[58] Field of Search ................ 350/321, 320, 610, 1.1, 350/1.7, 641; 505/1, 776, 705, 727

[56] References Cited
U.S. PATENT DOCUMENTS 4,043,809  8/1977  Ruvalds ................................ 505/1
4,764,003  8/1988  Lake et al. ........................ 350/610
4,886,776 12/1989  Early et al. ...................... 350/320

OTHER PUBLICATIONS

Muller and Bednorz—The Discovery of a Class of High-Temperature Superconductors, Article 1133, Science, vol. 237; Article 1135, vol. 237; and Article 1137, vol. 237, Sep. 4, 1987.

Primary Examiner—Bruce Y. Arnold
Assistant Examiner—Loha Ben
Attorney, Agent, or Firm—Herbert Dubno

[57] ABSTRACT

Switchable superconducting mirrors and reflectors are switched from the reflective to the absorbing, and/or transparent, modes to modulate signals.

29 Claims, 3 Drawing Sheets ing energies are needed in order to be able to reflect at much shorter wavelengths.

Until recently, it was believed that superconductivity above 23° K., and therefore band gaps in excess of 3 milli-electronvolts were not possible. This belief was rooted in the theoretical work now named the BCS theory (Bardeen, Cooper and Schrieffer) which predicted such an upper limit. As a result, no research in the field of superconducting mirrors and reflectors can be cited by me.

The temperature at which superconductivity may occur in a superconductor (in the absence of any external magnetic fields) is termed the critical temperature of that superconductor and this term will be used herein.

In the early 1970's a number of theoretical proposals were presented, suggesting that the critical temperature for superconductivity could be increased. (V. L. Ginzburg, Usp. Fiz. Nauk. 101, 185 (1970))'(D. Allender, J. Bray, J. Bardeen, Phys. Rev. B8, 4433 (1973)). A significant experimental breakthrough in high temperature superconductivity (critical temperatures in excess of 23° K.) was provided in November 1986 by Bednorz and Muller when they published a tentative disclosure of high temperature superconductivity (Georg Bednorz and Alex Muller, Z. Phys. B64, 189 (1986)). Rapid confirmation by others soon occurred. For instance, a report cites a critical temperature above 30° K. for $La_{(2-x)}Ba_{(x)}CuO_{(4-y)}$, (H. Takagi, S. Uchida, K. Kitazawa, S. Tanaka, Jpn. J. Appl. Phys. 26, L123 (1987)). Confirmation of a critical temperature of 93° K. was reported by Chu for an yttrium-barium-copper oxide ceramic (M. K. WU, J. R. Ashburn, C. J. Tang, P. H. Hor, R. L. Meng, L. Gao, Z. J. Huang, Y. Q. Wang, and C. W. Chu, Phys. Rev. Lett. 58, Mar. 2, 1987, p. 908.) This material was dubbed the 123 compound and has served as a model for advanced research in the field.

During 1987 and 1988, a number of families of high temperature superconductors were discovered with confirmed critical temperatures all the way to 162° K. These materials were usually ceramics containing copper (whose apparent valence state appears to be trivalent), an alkaline metal (Ca, Sr, or Ba) and a rare earth, including yttrium. Most of these superconductors showed some degree of anisotropy in their properties and it was therefore significant when a cubic ceramic with a critical temperature above 23° K. (specifically 30° K.) was discovered based on a complex oxide of Ba, K and Bi. This superconductor was the first high temperature superconductor without copper in its composition, thus indicating that the occurrence of high temperature superconductivity may be more prevelent than had been realized heretofore. Additionally, amorphous high temperature superconductors have also been reported (based on the bismuth compounds in which some of the bismuth was replaced with lead). The critical temperatures and critical current of these amorphous superconductors are somewhat lower than those of their crystalline counterparts.

There are some scattered reports of superconductivity above 162° K. For instance, R. G. Kulkarui has reported superconducting oxides having an approximate composition $CaO_{(0.5)}ZnO_{(0.5)}Fe_2O_4$. Ogushi reported superconductivity at room temperature in yet ill-defined niobium strontium lanthanum oxides. While these reports have yet to be confirmed independently by other researchers, it is reasonable to expect superconductors having critical temperatures near to room

SWITCHABLE SUPERCONDUCTING MIRRORS

FIELD OF THE INVENTION

This invention relates to a new family of optical devices having the unique capability of modulating, essentially electronically, a beam of electromagnetic energy that impinges on said devices, by abruptly and reversibly switching on or off the reflective properties of a unique mirror or reflector. Such mirrors or reflectors have been discussed in a co-pending application (Ser. No. 07/292,469 filed Dec. 30, 1988) entitled "Superconducting Mirrors."

BACKGROUND OF THE INVENTION

Modulation of electromagnetic radiation has been accomplished in the past either by mechanical means, or by electro-optical and magneto-optical means. Mirrors mounted on appropriate electroacoustical transducers have also been used for light modulation. The prior art has a number of intrinsic shortcomings which the instant invention resolves. Mechanical modulation has usually involved the rotation of mirrors or their translational movements, or the use of mechanical shutters and choppers. Due to the mechanical nature of these devices, major limitations on speed of operation as well as limitations on available size have existed. For these reasons, electroacoustical transducers on which mirrors are mounted (or deposited) are rapidly replacing mechanical modulation in many of the more demanding applications.

Electro-optical and magneto-optical devices are electronically controllable and thus perform intrinsically faster than mechanical means of optical modulation. The devices act mostly on light transmitted through such devices by modulating the index of refraction of the electro-optical or magneto-optical crystals therein incorporated. As a result, both families of devices absorb an appreciable amount of the impinging light in any of their states, and their operation, particularly in high energy density applications (lasers) is hampered by optical and heating losses.

The loss problem is less severe in traditional mirrors, and thus for high energy density applications (like lasers) mechanically modulated mirrors are preferred. Nevertheless, even the best traditional mirrors, having the best normal conductors (gold, silver, copper and aluminum) as reflecting surfaces, absorb close to one percent of the incident light. This shortcoming, coupled with restrictions imposed by the mechanical nature of modulation, limits the application of traditional mirror technology when the reflected beams, such as those found in laser technology, have extremely high energy densities.

Classical superconductors have never been considered for mirror and other reflective applications despite their having conductivities which are better than those of normal conductors (such as gold, silver and copper). The reason is rooted in the simple fact that in known superconductors the high conductivity is due to pairing of charge carriers. This pairing involves a binding energy that for most classical superconductors is less than 3 milli-electronvolts. When electromagnetic radiation with any wavelength shorter than about 0.4 mm impinges on such classical superconductors, it is absorbed and in the process decouples the paired charge carriers. For most optical applications, including the infrared wavelengths, superconductors with much higher pairtemperature, with much higher electron-pair binding energy to become available in the near future.

In classical BCS superconductors, the optical band gap is equal to the electronic band gap (as measured on a Josephson junction) and is about $3.5\ kT_c$. However, in some of the high temperature superconductors, I have determined that observed critical temperature and the "optical" critical temperature are not equal, and that the optical critical temperature, which I have termed the "virtual critical temperature" can be much larger than thermodynamic critical temperature. As a result, the optical band gap can be much higher than $3.5\ kT_c$. I further find that for wave lengths longer than their optical band gap, selected superconductors reflect electromagnetic radiation more efficiently than normal metals, and that the absorption losses may be as much as three to four orders of magnitude lower than in gold.

I also find that when the superconductors are quenched by selected means into their normal state, they combine absorption, reflection and transmission of light at ratios that depends on the physical properties of their respective normal states. Thus, superconducting materials will be found to have charge carriers with virtual binding energy in excess of 2 electron-volts. This makes possible mirrors capable of reflecting electromagnetic radiation in the infrared as well as in the visible part of the spectrum. This postulation is based not only on the classical scaling of charge carriers binding energy with the thermodynamic critical temperature ($3.5\ kT_c$) (which would be insufficient to reach the infrared part of the spectrum unless critical temperatures of superconductors in excess of 500° K. are achieved), but particularly on my discovery that virtual critical temperatures can be more than twice the thermodynamic critical temperatures.

A further tenet is that some of these high temperature superconductors may have the unique property that, in their normal state, they are insulators and basically transmit electromagnetic radiation, at least within a specific band that depends on the electronic state of the normal state in a manner well known in the art. To differentiate between the different classes of superconductors and clearly define classes that are suitable for the practice of this invention, I have classified superconductors according to the nature of their corresponding normal state. Classical BCS superconductors are usually metallic in their normal state and therefore belong to a class I have denoted as (SC,M), namely, that below and above their critical temperatures, a superconducting and a normal metal phase exists, respectively. A few examples of this class of superconductors are mercury, niobium and its A15 intermetallic compounds with tin and germanium.

The new class of superconducting oxides, that are semimetals or semiconductors in their normal state, thus belong to a class that I denote as (SC,S) in a similar manner. Examples of superconductors belonging to this class are the 123 compounds and the bismuth based oxide superconductors. Finally the last class of superconductors of my new invention are insulators in their normal state and thus belong to a class that I denote as (SC,I). An example of this group is Kulkarui's superconducting spinel like compound with an approximate composition $CaO_{(0.5)}ZnO_{(0.5)}Fe_2O_4$.

I have determined that some superconductors belonging to the last two classes, have virtual critical temperatures that are higher than the actual, or thermodynamic critical temperature. I have further found that the differential is much larger for the superconducting oxides of the class (SC,I) with a normal insulating state. Thus, the present invention concerns only switchable mirrors made with, or of superconductors belonging to the (SC,S) class or the (SC,I) class, wherein the normal states are either semi-conducting (or semi-metal) or insulating, respectively.

I have found that such mirrors behave like perfect mirrors, at least to the wavelength energies which are equal to the binding energy of the superconducting charge-carrying pairs. While in the quenched phase, said mirrors combine absorption, reflection and transmission of light at ratios which depend on the physical properties of the normal state.

The classical superconductors (belonging to the class (SC,M), where the normal state is a normal metal) cannot be used as controllable mirrors because the electron pairing energy of these materials is too low. The main interaction between these superconductors and electromagnetic radiation is absorption, resulting in de-pairing of the superconducting electrons, provided the wavelengths are shorter than about 0.4 millimeter.

OBJECTS OF THE INVENTION

I have found that a variety of devices can be designed in which the heart of the device is a superconducting mirror that can be switched in and out of the superconducting phase, and as a result, the optical properties of these surfaces can be switched between two optical states.

Therefore, it is an object of the present invention to provide devices, based upon selected superconducting mirrors or reflectors, having vastly improved properties over those of the prior art.

Another object of the invention is to provide a self supporting mirror, based upon superconducting compounds, capable of being switched at will to the absorptive, and/or transmissive mode, and back to the reflective mode, by quenching the superconductor to its normal state, and then removing the quenching influence so as to allow the superconductor to return to its superconducting state.

Still another object is to provide a switchable superconducting mirror or reflector deposited on an appropriate substrate, which is capable of being switched from reflecting to the absorptive, and/or transmissive modes by quenching the superconductor to its normal state, and then removing the quenching influence to let the superconductor return to its superconducting state.

A final object of the invention is to provide means to effect said quenching of the mirror's superconducting substance, thereby controlling said mirror properties, coupled with the means of controlling said devices in which the controllable superconducting mirror forms the essence of said device.

SUMMARY OF THE INVENTION

Controllable mirrors or reflectors, based upon selected superconducting materials, are disclosed. Said mirrors can be switched from the reflecting mode to the absorptive, or transmissive mode, by quenching said superconducting materials to exceed their intrinsic critical temperature, thereby changing them to their normal states. The effect is reversible by removing the quenching influence thus causing the superconducting state to reappear. Methods of construction include self-supporting forms and deposition of thin layers of superconductors upon selected substrates.

I have found that there are two main groups of devices which can be based upon my new and improved switchable superconducting mirrors. These include:

A. Self supporting mirrors, which are particularly important when the switching is between reflection (superconducting state) and mostly transmission (normal state).

B. Mirrors on substrates, when the switching is between reflection (the superconducting state) and absorption (normal state). In this case, absorption may be caused by the superconductor film itself or by the substrate. Switchable reflectors that are essentially non-specular mirrors are best implemented in this form as well.

I have further found that in each of these two groups, mirrors can be produced that switch from the reflective mode to the transmissive mode, as well as mirrors that switch from the reflective mode to the absorptive mode. In the practice of the present invention, it is often practical (but not necessary) to operate mirrors in the first group that are mostly transmissive in their switched state (normal state) and in the second group mirrors or reflectors that are mostly absorptive in their switched state (non superconductive state). It should be understood however, that the instant invention easily allows the construction of a transmissive mirror (in the switched state) in the second group, if the substrate is transparent to the impinging electromagnetic radiation.

I have found that for mirrors that reflect wavelengths longer than about 10 microns, or the middle of the infrared range of the spectrum, superconducting substances belonging to the (SC,S) class should be used. When using superconductors of this class, the mirrors of my new invention are usually limited to the absorbing type mirror since the normal state is rarely transparent to the range of electromagnetic radiation used (wavelengths longer than about 10 microns). I have further found that for mirrors which reflect wavelengths in the visible and infrared spectrum, i.e.—wavelengths of 0.6 micron or less, superconductors substances belonging to the (SC,I) class, wherein the normal state is an insulator, should be used. Superconductors of this class are often transparent or partially transparent to the range of electromagnetic radiation used. If it is desired that the switched state of mirrors built with superconductors belonging to the (SC,I) class (namely their normal state is an insulator) be absorbing, I have found that an opaque substrate is required. In designs involving the self supporting mode, a relatively thick mirror must be built to allow for sufficient absorption in the normal state (insulating) of the superconductor.

Switching of superconducting mirrors or reflectors of the instant invention between the superconducting and normal state is achieved by three primary methods, and the combinations thereof. Specifically, these are:

A. Magnetic switching, in which an external magnetic field is imposed upon the mirror or reflector so that the field strength exceeds the critical field of the superconductor.

B. Current switching, wherein a current is passed through the superconducting film which exceeds the critical current of the superconductor.

C. Thermal switching, effected by raising the temperature of the mirror or reflector above the critical temperature of the superconductor.

Each of the above methods of my new invention essentially modifies the apparent critical temperature of the superconductor, so that it is equal to, or lower than, the operating temperature of the superconductor.

I have further determined that for any given ambient temperature which is lower than the superconductor's critical temperature, a magnetic field strength exists at which the said ambient temperature is critical. Similarly, a current density exists for the superconducting element where the said ambient temperature becomes critical. It should be obvious to those skilled in the art that any combination of the three switching means of the instant invention can be used as a switching mechanism between said superconducting and normal states.

I have established that the choice of the switching mode and the appropriate combination of switching modes depends on the specific application. For high speed applications, magnetic and critical current switching are the best methods. For low speed applications, thermal switching may be more appropriate.

BRIEF DESCRIPTION OF THE DRAWING

The above and other objects, features and advantages of my invention will become more readily apparent from the following description, reference being made to the accompanying highly diagrammatic drawing in which.

SPECIFIC DESCRIPTION

Figure 1A:
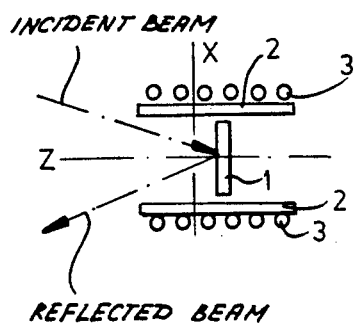
FIG. 1A is an axial cross sectional view through a superconducting mirror and the system for switching the same between reflective and transmissive states.
Figure 1B:
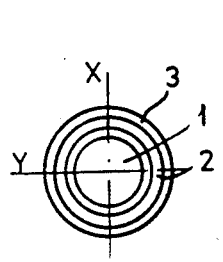
FIG. 1B is a transverse cross sectional view through the device of FIG. 1A.
Figure 1C:
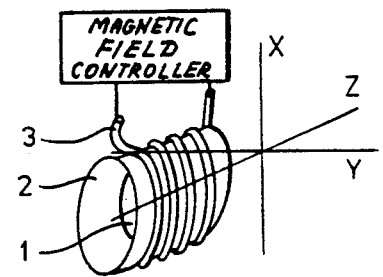
FIG. 1C is a generally perspective view thereof.

In FIGS. 1A-1C show a superconducting mirror capable of being switched by the application of an external magnetic field. The cross section FIG. 1A has an XZ plane. The magnetic field is applied in the Z direction by passing a DC current through a solenoid #3 which is coiled on a support structure #2. Cross section B in FIG. 1B is through the XY plane, which contains the mirror. FIG. 1C is a general view of the assembly. The numerals 1, 2 and 3 represent the same parts in all of these FIGS. In this case, the mirror itself can be either self supporting or be composed of a film deposited on a suitable substrate.

In FIGS. 1A-1C, the superconducting mirror 1 is shown to be deposited within a tube 2 and to be surrounded by a solenoid coil 3 which is energized by a magnetic field controller (FIG. 1C).

When the superconducting mirror is transparent in its normal state, I have found that this assembly can be used to modulate a light beam entering the assembly from one side, with the result of having the light beam emerging on the other side turned off and on. The light beam can be positioned in a direction perpendicular to, or close to perpendicular to, the mirror surface. The overall operation results in having a modulated beam exiting the assembly on the other side. This arrangement of my invention which uses a switchable superconducting mirror transparent in its switched state (when the superconductor is quenched to its normal state), is completely symmetric relative to the Z direction. It is obvious that one can have the impinging light coming from either direction and that the current in the solenoid can be reversed as well.

I have also found that, in order to limit current requirements for switching, it is desirable to optimize the operating temperature of the device relative to the critical temperature of the superconductor. This mandates a specific choice of the appropriate superconductor and its properties relative to expected operating temperatures. It should be obvious to persons trained in the art that the use of a superconducting coil drastically lowers the operating energy requirements of the system. This is explained in that energy will be expended only on each change (whether up or down) of the current but no joule heating losses will be incurred during the switched-on cycle time. This energy, associated mostly with circuit inductance, is much smaller than the expected resistive losses incurred during the operation of a normal non-superconducting solenoid.

Another application of the arrangement shown in FIGS. 1A–1C involves an absorbing mirror which is either self supporting or on a substrate. In this mode of operation of my invention, I have found that the impinging beam is best placed at an angle other than the perpendicular, so as to allow differentiation between the impinging and reflected beams. I have further established that the length of the solenoid, the position of the mirror within the solenoid and the width of the impinging beam does determine the angle of incidence relative to the mirror required for this application.

Figure 2C:
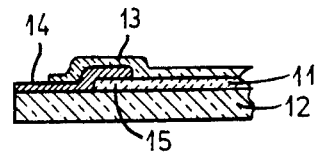
FIG. 2C is an enlarged section of a portion of FIG. 2B.
Figure 2B:
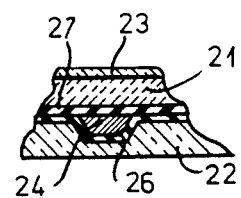
FIG. 2B is a cross section through a portion of the mirror.
Figure 2A:
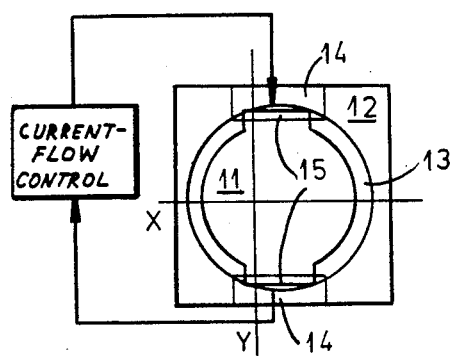
FIG. 2A is an end view of another switchable superconducting mirror arrangement according to the invention.

FIGS. 2A–2C depict another embodiment of my invention involving the critical current switching mode of the superconducting mirror. FIG. 2A is a top view of the mirror. The superconducting active element 11 is a circle with two protrusions 15 on which electrical contacts are made. Many other geometries are obviously possible, as long as a current can be passed through the active superconducting element. The superconductor is deposited on an appropriate substrate 12, which can be either transparent or opaque, depending on the intended application. The coating 13 is a transparent insulator that also serves as a barrier to any environmental threats to the superconductor. The electrical contacts 14 are exposed at their outer extremities to allow for external wires to be attached, while the area in contact with the superconductor is covered by the insulating layer 13.

FIG. 2B of FIG. 2 depicts a cross section of the same device through the direction X, and FIG. 2C depicts a cross section of the contact area (enlarged relative to FIGS. 2A and 2B) through the direction Y. I have found that the substrate itself can be made from an appropriate optically transparent material, thus allowing uses of the mirror wherein switching between the reflective and transparent modes is desired. When this use is intended, superconductors belonging to the (SC,I) class must be used. When it is desired that the mirror be opaque in the switched off state than an opaque substrate is used. However, when the device is intended to be used in mid to far infrared applications, superconductors belonging to the (SC,S) class, namely those with a normal state that is semiconducting, are used, In this case, the optical properties of the substrate are less important.

Switching the mirror of the device to the normal state (transmissive or absorptive state) is achieved by passing a current through the superconducting medium, in excess of the critical current of the said medium. In order to minimize said current required to achieve switching, the thickness of the superconducting medium must be controlled. However, it is advisable to keep the thickness of the superconducting medium larger than the magnetic field penetration depth. The contacts themselves can be chosen from a variety of appropriate metals, including but not limited to copper, silver or gold.

Figure 3C:
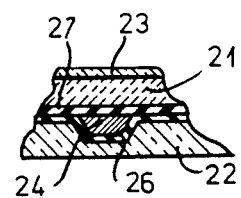
FIG. 3C is a detailed section of a portion of FIG. 3B.
Figure 3B:
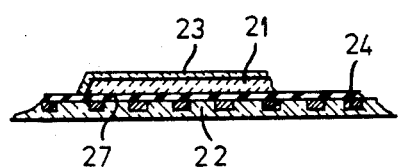
FIG. 3B is a section through a portion of the superconducting mirror.
Figure 3A:
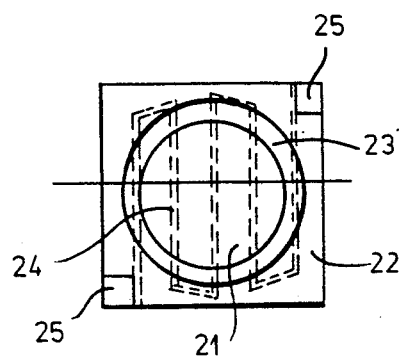
FIG. 3A is a view similar to FIG. 2A illustrating another embodiment.

FIGS. 3A–3C depicts still another embodiment of the instant invention involving the thermally switchable superconducting mirror. FIG. 3A shows a top view of the assembly. 21 is the superconducting medium which is supported by the substrate 22. An optically transparent coating 23, which is also an insulator and barrier to environmental threats, is deposited over the active element. In the substrate is a resistive heating element 24, made by depositing, as an example, nichrome in an appropriate depression in the substrate in a manner so that it can be connected to two contact pads 25.

In FIG. 3B, I show a cross section through the direction X, where an electrically insulating layer 27, which has the additional property of being a good thermal conductor, is placed. This layer can be constructed from: diamond-like carbon films, aluminum nitride, or beryllium oxide, as is known in the art. The said layer is deposited between the active superconducting layer and the substrate/heating element surface. In FIG. 3C, which is an enlargement of FIG. 3B, there is shown a single heating element channel. I have also found that prior to depositing the said heating element, if the substrate is electrically conducting, one can deposit an optional electrically insulating, but thermally conducting layer 26, on the channelled substrate. One may want to include in the design of the instant invention a thermally and electrically conductive substrate, so as to avoid charge build up in the system and to provide a heat sink as well. This mirror of the instant invention is simply activated by passing a current through the heating element which raises the temperature of the switchable superconducting element above its critical temperature.

The thermally switchable superconducting mirror will usually be a slower device with longer switching and recovery time than current or magnetically switchable superconducting mirrors. Some unique applications of such a mirror will be described below.

Figure 4A:
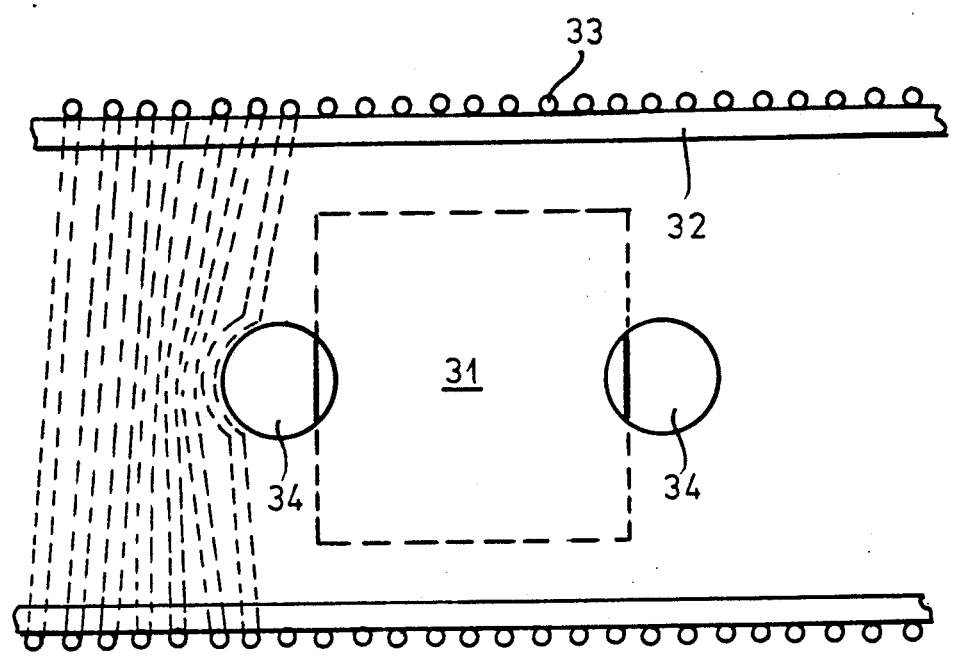
FIG. 4A is an axial section through another switchable mirror system according to the invention.
Figure 4B:
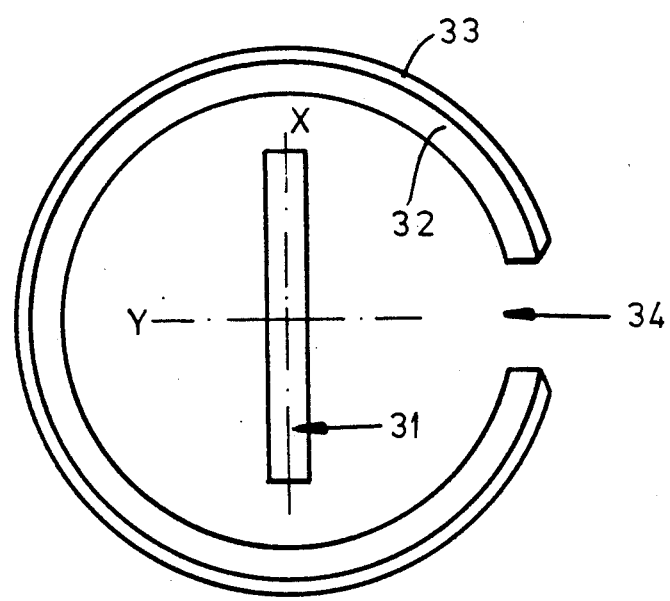
FIG. 4B is a transverse section through the device of FIG. 4A.

In FIGS. 4A and 4B, I show a magnetically switchable mirror with a cross-section coplanar with the magnetic field. I have found that this configuration usually requires higher magnetic fields to affect switching than other configurations. However, this geometry allows flexibility that is not available with a configurational design which uses the switchable mirror perpendicular to the magnetic field. FIG. 4A shows a cross section in the XZ plane, wherein 31 is the mirror, 32 the solenoid support, 33 the solenoid and 34 depicts projections of apertures for the modulated light beams (incoming and outgoing). FIG. 4B shows a cross section in the XY plane through one of the side apertures in the solenoid. It should be quite obvious to those skilled in the art that only minimal disturbances will occur in the magnetic field inside the solenoid, as affected by the apertures.

I have also found that it is possible to operate this design-configuration of the instant invention with the light beams impinging and exiting at a very shallow angles through the front and back of the solenoid itself (This design eliminates the apertures on the solenoid cylindrical walls). A further modification involves the self supporting transparent version of the mirror, where the apertures are on opposite sides of the solenoid's cylindrical walls.

I have also determined that there are ten different methods of switching a superconducting mirror or reflector from the reflecting to a non reflecting state. In the following description, H(C) is the critical magnetic field, J(C) is the critical current and T(C) is the critical temperature necessary each separately to effect said switching:

1. Switching of the superconducting mirrors by the application of a magnetic field larger than H(C).
2. Switching of the superconducting mirrors by the application of a current larger than J(C).
3. Switching of the superconducting mirrors by the application of heat to increase the temperature of the mirror above T(C).
4. Switching of the superconducting mirrors by applying a priming magnetic field H(1) below H(C) and (simultaneously or consecutively) applying a current, under J(C) at H=0, but larger than J(C,H(1)).
5. Switching of the superconducting mirrors by applying a priming magnetic field H(1) below H(C) and (simultaneously or consecutively) applying heat to raise the temperature above T(C,H(1)).
6. Switching of the superconducting mirrors by the application of a priming current J(1) under J(C) and (simultaneously or consecutively) applying a magnetic field larger than H(C,J(1)).
7. Switching of the superconducting mirrors by the application of a priming current J(1) under J(C) and (simultaneously or consecutively) applying heat raising the temperature above T(C,J(1)).
8. Switching of the superconducting mirrors by raising the mirror temperature to T(1) under T(C) and (simultaneously or consecutively) the application of a magnetic field larger than H(C,T(1)).
9. Switching of the superconducting mirrors by raising the mirror temperature to T(1) under T(C) and (simultaneously or consecutively) the application of a current larger than J(C,T(1)).
10. Switching a superconducting mirror by priming it with any two of the three parameters (T,H,J,), under their combined critical values and switching by the application of the third parameter above its now critical value. These combinations may be summarized specifically as:
   a. Apply H(1)<H(C), T(1)<T(C,H(1) switch with J>J(C,T(1),H(1)).
   b. Apply J(1)<J(C), T(1)<T(C,J(1)); switch with H>H(C,T(1)J(1)).
   c. Apply H(1)<H(C), J(1)<J(C,H(1)); switch with T>T(C,H(1),J(1)).

The apparatus of FIGS. 1A–1C can be used:

1. For applications in signal conversion in telecommunication-one uses the apparatus of FIG. 1 to convert a digital voltage or current signal to a light signal, by applying the signal to either the solenoid or as J(C) pulses on a SUPERCONDUCTING SWITCHABLE MIRROR APPARATUS on which a fixed laser beam is impinging.

2. Optical encoders where the mirror function can be precisely controlled, and so encode an impinging beam from a preset signal as in Example 1.

3. Individually switchable pixels in a pixel array for: a. Flat screen displays, b. Billboards, c. Large and giant screen TV., d. Transparent displays, e. Projection displays. The advantage of the instant invention is that extremely high display screen brightnesses are available and are dependent only upon the actual light source, not the source being modulated.

4. High efficiency strobe lights (instead of switching the filament on and off, the front window is switched, the filament is continuously on, and the light is captured by internal reflection until the next "on" cycle. To increase efficiency in this apparatus, a fixed superconducting mirror is used for the back mirror.

5. Switchable reflection on window panes to control the sun's rays in summer or in winter, for climate control in industrial and commercial buildings, green houses and private homes.

6. Switchable mirrors for a myriad of laser applications. These applications are particularly important in high power lasers where one wants to avoid all reflection losses.

Figure 5:
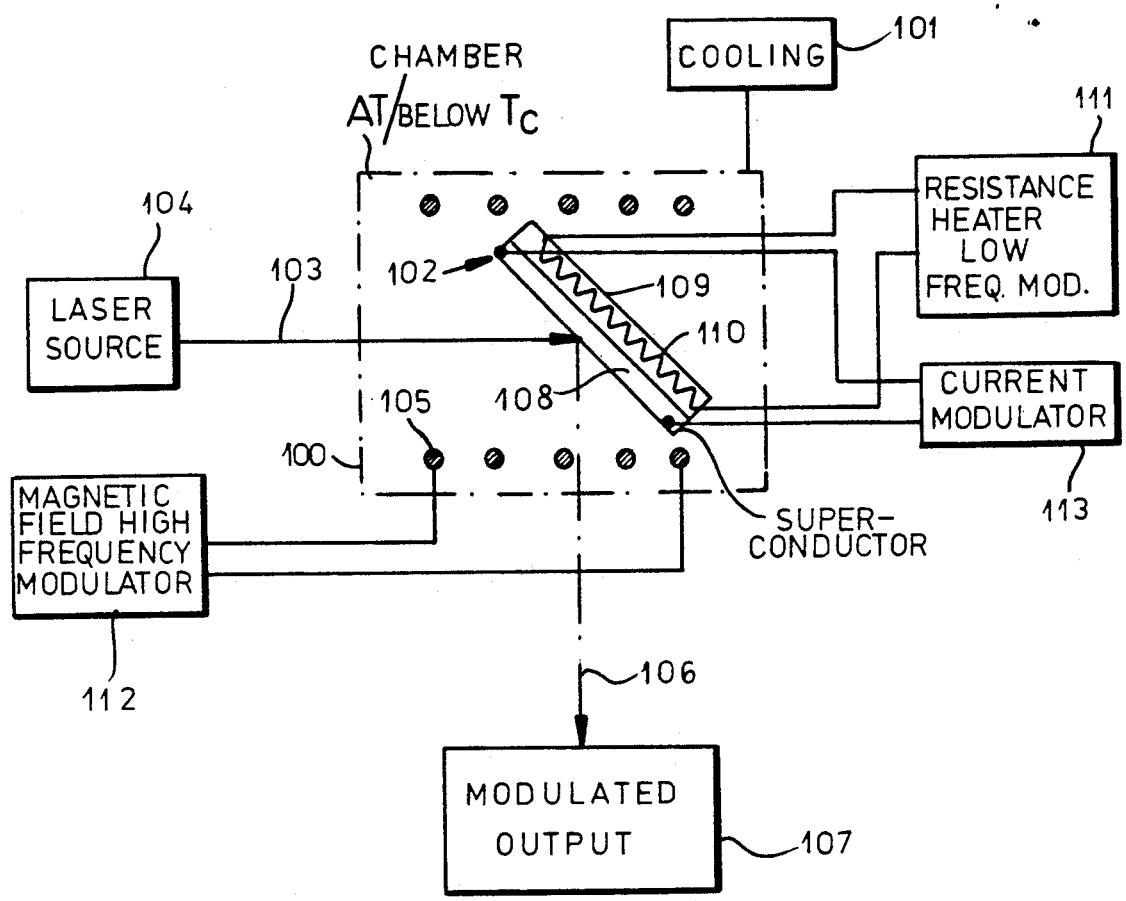
FIG. 5 is a block circuit diagram and diagrammatic illustration of a mirror system according to another embodiment of this invention.

FIG. 5 is a diagrammatic sectional view of an apparatus in accordance with the present invention which comprises a chamber 100 which is maintained below the critical temperature $T_c$ by an appropriate cooling apparatus represented generally at 101 and which can be a source of a liquefied gas which is admitted to the chamber.

Within the chamber, the mirror 102 is provided so that it is in the path of a laser beam 103 from a source 104 such that the laser beam enters axially with respect to a magnet coil 105 surrounding the mirror 102. The reflected beam 106 exits between turns of the coil to a device which can include an optoelectronic transducer and outputting a modulated signal at 107.

The mirror 102 can be a layer of the 1, 2, 3 superconductor 108 upon an electrically insulating substrate 109 which may be high-density aluminum nitride or beryllium oxide and which preferably contains a resistive heating element 110 or is constituted as a resistive heating element.

Modulation in the device of FIG. 5 can be effected in a variety of ways according to the invention.

For example, the input to the resistance heater from a source 111 can vary the temperature to swing it to opposite sides of the critical temperature $T_c$ and thereby effect a low-frequency modulation without application of a magnetic field. Alternatively, without application of any additional heat through the resistance heater, i.e. under the critical temperature $T_c$ of the superconductor mirror, the output can be modulated at a higher frequency by applying a variable magnetic field with alternating energization of the coil 105 via the coil energizing source 112.

As another alternative, the source 113 connected across the superconductive layer may pass a critical current variably through the superconductor in the absence of an applied magnetic field or heating via the source 111 to effect a high-frequency modulation.

Various combinations of modulations are also possible. For instance, both current and magnetic field modulation may be used or both current or magnetic field and thermal modulation may be used, or a combination of all three modulations may be used. It has been found to be advantageous to apply either a magnetic field or a current less than the critical magnetic field or critical current required for switching or modulation and then effect the modulation by a change in temperature, applied current or applied magnetic field while the priming magnetic field or current remains constant in the respective case.

I claim:

1. A reflection apparatus, comprising:
   a source of electromagnetic radiation emitting a beam of photons of a given wavelength corresponding to a given energy;
   a superconducting mirror having a reflective surface in a path of said beam and having charge carrying pairs with a respective optical binding energy, said given wavelength being greater than a wavelength at which the photon energy is equal to said optical binding energy, whereby at temperatures below a critical temperature of the superconducting mirror corresponding to a superconductive mode, said surface is reflective to said beam, and the superconducting mirror can be quenched to a nonsuperconductive mode to extinguish reflection of said beam by said surface; and
   means operatively coupled to said superconducting mirror for selectively quenching said superconducting mirror to said nonsuperconductive mode.

2. The reflection apparatus defined in claim 1, wherein said mirror comprises a substrate and said surface is formed by a layer of superconductive material deposited on said substrate to a thickness greater than a superconductor magnetic field penetration depth of said superconductive material.

3. The reflection apparatus defined in claim 1, wherein said mirror is a self supporting body of a superconductive material.

4. The reflection apparatus defined in claim 1, wherein said mirror is composed of a superconductive material which is at least partially transparent to said beam in said nonsuperconductive mode.

5. The reflection apparatus defined in claim 1, wherein said mirror is composed of a superconductive material which is opaque to said beam in said nonsuperconductive mode.

6. The reflection apparatus defined in claim 1, wherein said means operatively coupled to said superconducting mirror for selectively quenching said superconducting mirror to said nonsuperconductive mode includes means for applying a magnetic field to said mirror at said surface in excess of a critical magnetic field at an operating temperature of the mirror.

7. The reflection apparatus defined in claim 6, wherein said means for applying said magnetic field is a coil.

8. The reflection apparatus defined in claim 7, wherein said coil is wound from a superconductive wire.

9. The reflection apparatus defined in claim 7, wherein said surface is positioned generally parallel to the magnetic field produced by said coil and said beam enters from one end of said coil at a small angle to said surface and leaves at an opposite end.

10. The reflection apparatus defined in claim 7 wherein said surface is positioned generally parallel to the magnetic field produced by said coil, said coil has openings between turns thereof, and said beam enters from one of said openings between turns of said coil and leaves through another of said opening between turns of the coil.

11. The reflection apparatus defined in claim 7, wherein said surface is positioned generally perpendicular to the magnetic field produced by said coil and said beam enters from one end of said coil and leaves at said one end.

12. The reflection apparatus defined in claim 7, wherein said surface is positioned at an angle to the magnetic field produced by said coil and said beam enters from one end of said coil and leaves through an opening between turns of the coil.

13. The reflection apparatus defined in claim 7, wherein said surface is transparent in its non-superconductive state and positioned generally transverse to the magnetic field produced by said coil and said beam enters from one end of said coil.

14. The reflection apparatus defined in claim 1, wherein said means operatively coupled to said superconducting mirror for selectively quenching said superconducting mirror to said nonsuperconductive mode includes means for passing a direct current through said mirror at said surface at a current density in excess of a critical current density at an operating temperature of the mirror.

15. The reflection apparatus defined in claim 14, wherein said means for passing a direct current includes superconductive leads connected to said mirror.

16. The reflection apparatus defined in claim 1, wherein said means operatively coupled to said superconducting mirror for selectively quenching said superconducting mirror to said nonsuperconductive mode includes means for heating said mirror at said surface to a temperature in excess of said critical temperature.

17. The reflection apparatus defined in claim 1, wherein said means operatively coupled to said superconducting mirror for selectively quenching said superconducting mirror to said nonsuperconductive mode includes means for applying a magnetic field to said mirror of a field strength less than that at which said surface is switched to said nonsuperconductive mode at zero current, and means for applying a direct-current through said mirror, said direct current being less than that at which said surface is switched to said nonsuperconductive mode at zero magnetic field whereby the combination of said applied magnetic field and said direct-current is sufficient to switch said surface to said nonsuperconductive mode.

18. The reflection apparatus defined in claim 1, wherein said means operatively coupled to said superconducting mirror for selectively quenching said superconducting mirror to said nonsuperconductive mode includes means for applying a magnetic field to said mirror of a field strength less than that at which said surface is switched to said nonsuperconductive mode at zero current, and means for increasing the temperature at said surface to a temperature less than said critical temperature but sufficient to quench said surface to said nonsuperconductive mode in the presence of said magnetic field.

19. The reflection apparatus defined in claim 1, wherein said means operatively coupled to said superconducting mirror for selectively quenching said superconducting mirror to said nonsuperconductive mode includes means for applying a direct-current to said mirror, said direct current being less than that at which said surface is switched to said nonsuperconductive mode at zero magnetic field, and means for increasing the temperature at said surface to a temperature less than said critical temperature but sufficient to quench said surface to said nonsuperconductive mode in the presence of said current.

20. The reflection apparatus defined in claim 1, wherein said means operatively coupled to said superconducting mirror for selectively quenching said superconducting mirror to said nonsuperconductive mode includes means for applying a magnetic field to said mirror of a field strength less than that at which said surface is switched to said nonsuperconductive mode at zero current, means for applying a direct-current to said mirror itself less than that at which said surface is switched to said nonsuperconductive mode at zero magnetic field, and means for increasing the temperature at said surface to a temperature less than said critical temperature but sufficient to quench said surface to said nonsuperconductive mode when both said applied magnetic field and said current are applied to said surface.

21. The reflection apparatus defined in claim 1, wherein said mirror is provided with an electrically operated heating element.

22. A method of operating a reflection apparatus, comprising the steps of:
    (a) training from a source of electromagnetic radiation a beam of photos of a given wavelength corresponding to a given energy along a beam path;
    (b) positioning along said path a superconducting mirror having a reflective surface having charge carrying pairs with a respective optical binding energy, said given wavelength being than a wavelength at which the photon energy is equal to said optical binding energy, whereby at temperatures below a critical temperature of the superconducting mirror corresponding to a superconductive mode, said surface is reflective to said beam, and the superconducting mirror can be quenched to a nonsuperconductive mode to extinguish reflection of said beam by said surface; and
    (c) selectively quenching said superconducting mirror to said nonsuperconductive mode thereby modulating said beam.

23. The method defined in claim 22, wherein said mirror is selectively quenched to said nonsuperconductive mode by applying a magnetic field to said mirror at said surface in excess of a critical magnetic field at an operating temperature of the mirror.

24. The method defined in claim 22, wherein said mirror is selectively quenched to said nonsuperconductive mode by passing a direct current through said mirror at said surface at a current density in excess of a critical current density at an operating temperature of the mirror.

25. The method defined in claim 22, wherein said mirror is selectively quenched to said nonsuperconductive mode by heating said mirror at said surface to a temperature in excess of said critical temperature.

26. The method defined in claim 22, wherein said mirror is selectively quenched to said nonsuperconductive mode by applying a magnetic field to said mirror of a field strength less than that at which said surface is switched to said nonsuperconductive mode at zero current, and by applying a direct-current through said mirror, said direct current being less than that at which said surface is switched to said nonsuperconductive mode at zero magnetic field whereby the combination of said magnetic field and said direct-current is sufficient to switch said surface to said nonsuperconductive mode.

27. The method defined in claim 22, wherein said mirror is selectively quenched to said nonsuperconductive mode by applying a magnetic field to said mirror of a field strength less than that at which said surface is switched to said nonsuperconductive mode at zero current, and by increasing the temperature at said surface to a temperature less than said critical temperature but sufficient to quench said surface to said nonsuperconductive mode.

28. The method defined in claim 22, wherein said mirror is selectively quenched to said nonsuperconductive mode by applying a direct current to said mirror, said direct current being less than that at which said surface is switched to said nonsuperconductive mode at zero magnetic field, and by increasing the temperature at said surface to a temperature less than said critical temperature but sufficient to quench said surface to said nonsuperconductive mode.

29. The method defined in claim 22, wherein said mirror is selectively quenched to said nonsuperconductive mode by applying a magnetic field to said mirror of a field strength less than that at which said surface is switched to said nonsuperconductive mode at zero current, by applying a direct-current to said mirror, said direct-current being less than that at which said surface is switched to said nonsuperconductive mode at zero magnetic field, and by increasing the temperature at said surface to a temperature less than said critical temperature but sufficient to quench said surface to said nonsuperconductive mode.

* * * * *